US010373683B2

(12) United States Patent
Nagai

(10) Patent No.: US 10,373,683 B2
(45) Date of Patent: Aug. 6, 2019

(54) DRAM DEVICE WITH EMBEDDED FLASH MEMORY FOR REDUNDANCY AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/868,955

(22) Filed: Jan. 11, 2018

(65) Prior Publication Data
US 2018/0286481 A1 Oct. 4, 2018

(30) Foreign Application Priority Data

Mar. 30, 2017 (CN) .......................... 2017 1 0201701

(51) Int. Cl.
H01L 21/311 (2006.01)
H01L 21/3213 (2006.01)
(Continued)

(52) U.S. Cl.
CPC ........ G11C 14/0018 (2013.01); G11C 29/789 (2013.01); G11C 29/824 (2013.01); H01L 21/28035 (2013.01); H01L 21/31111 (2013.01); H01L 21/32133 (2013.01); H01L 27/10894 (2013.01); H01L 27/11573 (2013.01); H01L 29/4925 (2013.01); H01L 29/66833 (2013.01); H01L 29/792 (2013.01); G11C 11/401 (2013.01); G11C 16/0466 (2013.01); G11C 2229/723 (2013.01); H01L 21/28282 (2013.01);
(Continued)

(58) Field of Classification Search
CPC ............ G11C 14/0018; G11C 16/0466; H01L 21/28035; H01L 21/28282; H01L 21/31111; H01L 21/32133; H01L 27/10823; H01L 27/10876; H01L 27/10885; H01L 27/10894; H01L 27/10814; H01L 29/4925; H01L 29/66833; H01L 29/792; H01L 29/513; H01L 29/518
See application file for complete search history.

(56) References Cited

U.S. PATENT DOCUMENTS 6,258,667 B1 7/2001 Huang
6,569,729 B1 5/2003 Wu
(Continued)

OTHER PUBLICATIONS

Bosson, "Technology and Manufacturing", May 23, 2006.

Primary Examiner — Mamadou L Diallo
(74) Attorney, Agent, or Firm — Winston Hsu

(57) ABSTRACT

A DRAM device with embedded flash memory for redundancy is disclosed. The DRAM device includes a substrate having a DRAM array area and a peripheral area. The peripheral area includes an embedded flash forming region and a first transistor forming region. DRAM cells are disposed within the DRAM array area. Flash memory is disposed in the embedded flash forming region. The flash memory includes an ONO storage structure and a flash memory gate structure. A first transistor is disposed in the first transistor forming region.

6 Claims, 7 Drawing Sheets

(51) Int. Cl.
    *H01L 21/28*     (2006.01)
    *H01L 29/49*     (2006.01)
    *G11C 14/00*     (2006.01)
    *H01L 27/108*     (2006.01)
    *H01L 29/66*     (2006.01)
    *H01L 29/792*     (2006.01)
    *G11C 29/00*     (2006.01)
    *H01L 27/11573*     (2017.01)
    *G11C 16/04*     (2006.01)
    *H01L 29/51*     (2006.01)
    *G11C 11/401*     (2006.01)

(52) U.S. Cl.
    CPC .. *H01L 27/10814* (2013.01); *H01L 27/10823* (2013.01); *H01L 27/10876* (2013.01); *H01L 27/10885* (2013.01); *H01L 29/513* (2013.01); *H01L 29/518* (2013.01)

(56) References Cited

U.S. PATENT DOCUMENTS

| | | |
|---|---|---|
| 8,409,950 B1 | 4/2013 | Shea |
| 10,062,573 B1* | 8/2018 | Ramkumar ....... H01L 21/28282 |
| 2005/0174847 A1 | 8/2005 | Forbes |
| 2009/0203188 A1* | 8/2009 | Shin .................. H01L 21/76229 438/435 |
| 2011/0079857 A1* | 4/2011 | Lee ................ H01L 21/823807 257/369 |
| 2013/0234252 A1 | 9/2013 | Lee |
| 2018/0175042 A1* | 6/2018 | Jang ................. H01L 27/10852 |

\* cited by examiner

DRAM DEVICE WITH EMBEDDED FLASH MEMORY FOR REDUNDANCY AND FABRICATION METHOD THEREOF

CROSS REFERENCE TO RELATED APPLICATION

This application claims the priority from CN application No. 201710201701.5, filed Mar. 30, 2017, which is included in its entirety herein by reference.

BACKGROUND OF THE INVENTION

1. Field of the Invention

The present invention relates to a semiconductor device and a manufacturing method thereof, and more particularly, to a DRAM device with embedded flash memory and a method of manufacturing the same.

2. Description of the Prior Art

It is known that a redundant efuse or laser fuse is often provided in a dynamic random access memory (DRAM) chip for repairing failures in the chip.

However, the redundant efuse or laser fuse occupies very much the area of the chip and is not rewritable. In addition, although smaller than the effuse, the laser fuse requires additional high-voltage circuit design.

Therefore, there is still a need in the art for a more compact embedded device for redundancy, which is smaller in size and is capable of providing chip repair or test functionality with high reliability, and is rewritable, which is compatible with the DRAM manufacturing process.

SUMMARY OF THE INVENTION

It is one objective of the present invention to provide a dynamic random access memory with embedded flash memory and its manufacturing method to solve the above shortcomings and disadvantages of the prior art.

According to an embodiment of the present invention, a method for fabricating a dynamic random access memory (DRAM) device with embedded flash memory is disclosed. First, a semiconductor substrate is provided, having a DRAM array region and a peripheral region, wherein the peripheral region includes an embedded flash memory forming region and a first transistor forming region. At least an oxide-nitride-oxide (ONO) layer is formed on the DRAM array region and the peripheral region.

The ONO layer is patterned to form an ONO storage structure in the embedded flash memory forming region and expose the semiconductor substrate in the first transistor forming region. A first gate oxide layer is formed on the semiconductor substrate in the first transistor forming region. A first gate conductive layer is blanket deposited on the DRAM array region and the peripheral region.

A contact hole etching process is performed on the DRAM array region to etch through the first gate conductive layer, the ONO layer and a portion of the semiconductor substrate to form a contact hole. A second gate conductive layer is blanket deposited over the DRAM array region and the peripheral region. The second gate conductive layer fills into the contact hole to form a contact structure.

A metal layer is formed on the second gate conductive layer. The metal layer and the first and second gate conductive layers are patterned, thereby forming a flash memory gate on the ONO storage structure in the embedded flash memory forming region, a first transistor gate structure in the first transistor forming region, and at least one bit line in the DRAM array region.

According to another embodiment of the present invention, there is provided a DRAM device with an embedded flash memory, comprising a semiconductor substrate having a DRAM array region and a peripheral region. The peripheral region includes an embedded flash memory forming region and a first transistor forming region.

A plurality of DRAM memory cells is disposed in the DRAM array region. A flash memory is disposed in the embedded flash memory forming region. The flash memory comprises an ONO storage structure and a flash memory gate. A first transistor is disposed in the first transistor forming region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is not intended to limit the present invention. The scope of the invention is defined by the claims. Equivalent to the claims of the present invention should also fall within the scope of the present invention.

Please refer to FIG. 1 to FIG. 7, which illustrate a method for fabricating a DRAM device with an embedded flash memory according to an embodiment of the present invention. According to an embodiment of the present invention, the embedded flash memory is a silicon-oxide-nitride-oxide-silicon (SONOS) type flash memory device.

Figure 1:
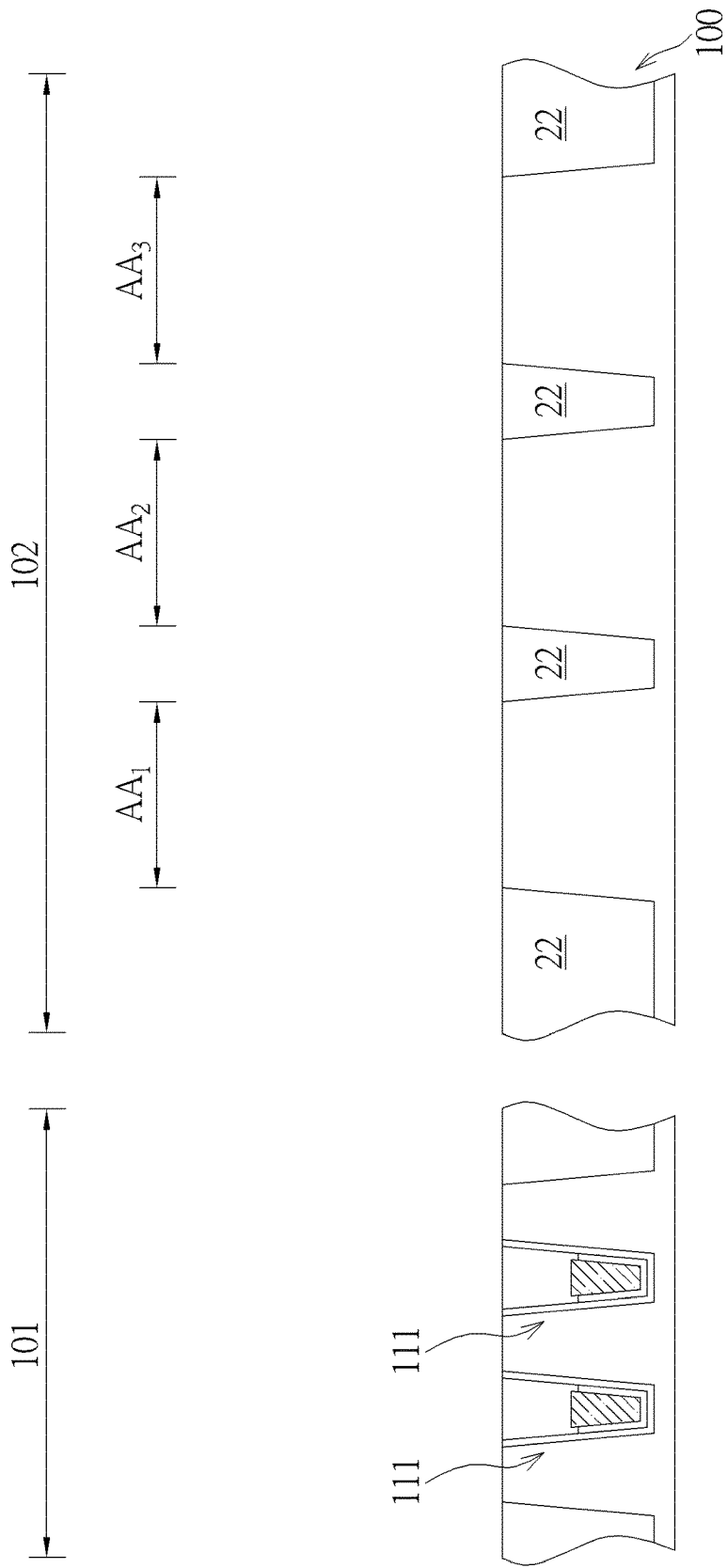
FIG. 1 to FIG. 7 illustrate a method for fabricating a DRAM device with an embedded flash memory according to an embodiment of the present invention.

As shown in FIG. 1, a semiconductor substrate 100 is first provided, wherein the semiconductor substrate 100 may be, for example, a silicon substrate, a silicon-containing substrate such as SiC substrate, a group III-V substrate such as GaN substrate, a III-V on silicon substrate such as GaN-on-silicon substrate, a graphene-on-silicon substrate, a silicon-on-insulator (SOI) substrate, an epitaxial layer containing substrate, or other suitable semiconductor substrates.

According to an embodiment of the present invention, the semiconductor substrate 100 has a DRAM array region 101 and a peripheral region 102. The peripheral region 102 also includes an embedded flash memory forming region (or a first active region) $AA_1$, a first transistor forming region (or second active region) $AA_2$, and a second transistor forming region (or third active region) $AA_3$. The peripheral region 102 further includes a trench isolation structure 22 electrically insulating the embedded flash memory forming region $AA_1$, the first transistor forming region $AA_2$ and the second transistor forming region $AA_3$ from each other.

According to an embodiment of the present invention, a plurality of buried word lines 111 is formed in the DRAM array region 101. Since the method of forming the buried word lines 111 is a well-known technique, details are not described again. After the formation of the buried word lines 111 is completed, the semiconductor substrate 100 has a flat top surface at this point.

Figure 2:
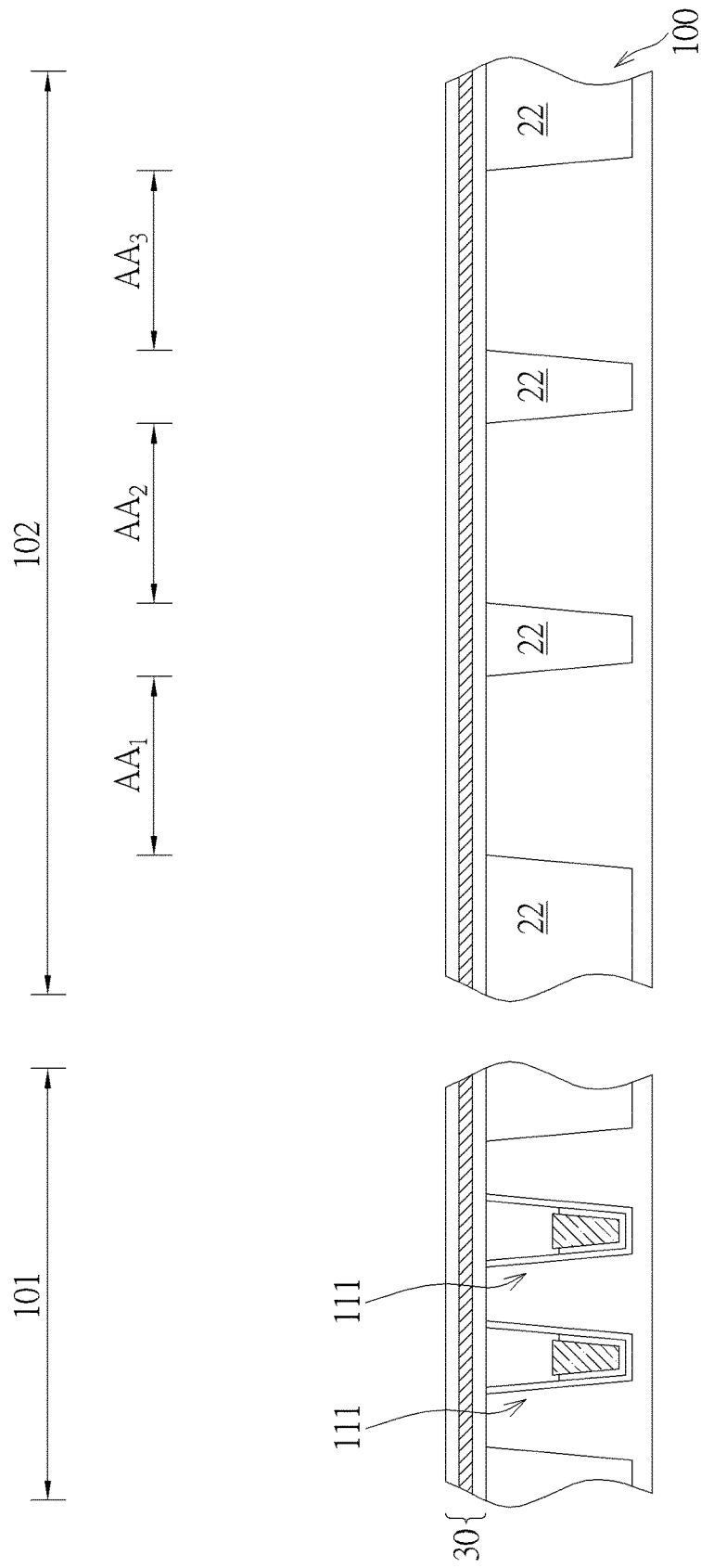

As shown in FIG. 2, at least a silicon oxide-silicon nitride-silicon oxide (ONO) layer 30 is then formed on the entire DRAM array region 101 and the peripheral region 102. According to an embodiment of the present invention, the ONO layer 30 is mainly used as an etch stop layer during subsequent bit line etching process.

Figure 3:
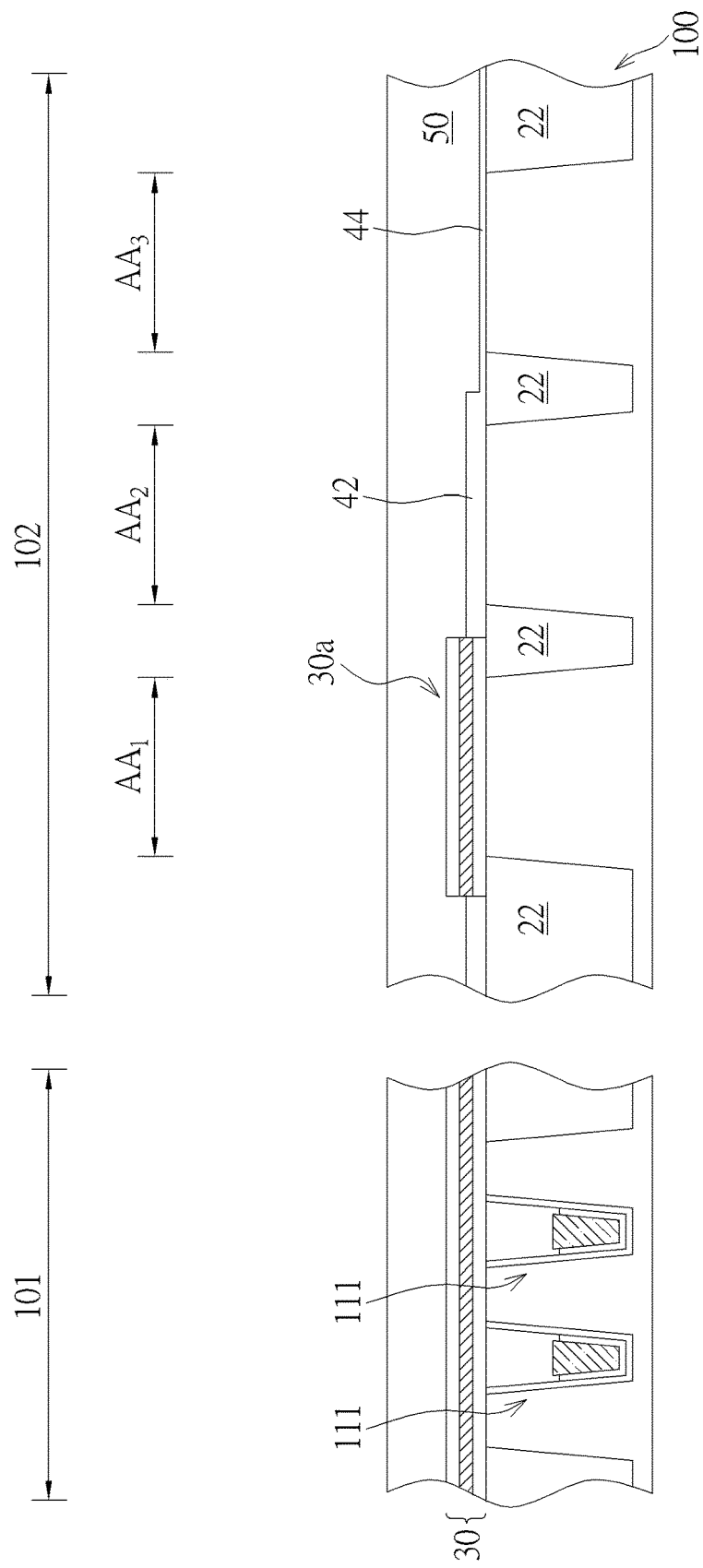

As shown in FIG. 3, the ONO layer 30 is then patterned by a photolithographic process and an etching process to form an ONO storage structure 30a on the embedded flash memory forming region $AA_1$ and expose the top surface of the semiconductor substrate 100 in the first transistor forming region $AA_2$ and the second transistor forming region $AA_3$. In other words, in this step, the ONO layer 30 is removed except for the DRAM array region 101 and the embedded flash memory forming region $AA_1$.

Subsequently, a first gate oxide layer 42 is formed on the semiconductor substrate 100 in the first transistor forming region $AA_2$, and a second gate oxide layer 44 is formed on the semiconductor substrate 100 in the second transistor forming region $AA_3$. The thickness of the first gate oxide layer 42 is greater than the thickness of the second gate oxide layer 44.

Next, a first gate conductive layer 50 is blanket deposited on the DRAM array region 101 and the peripheral region 102. According to an embodiment of the present invention, the first gate conductive layer 50 may include polysilicon, but is not limited thereto.

Figure 4:
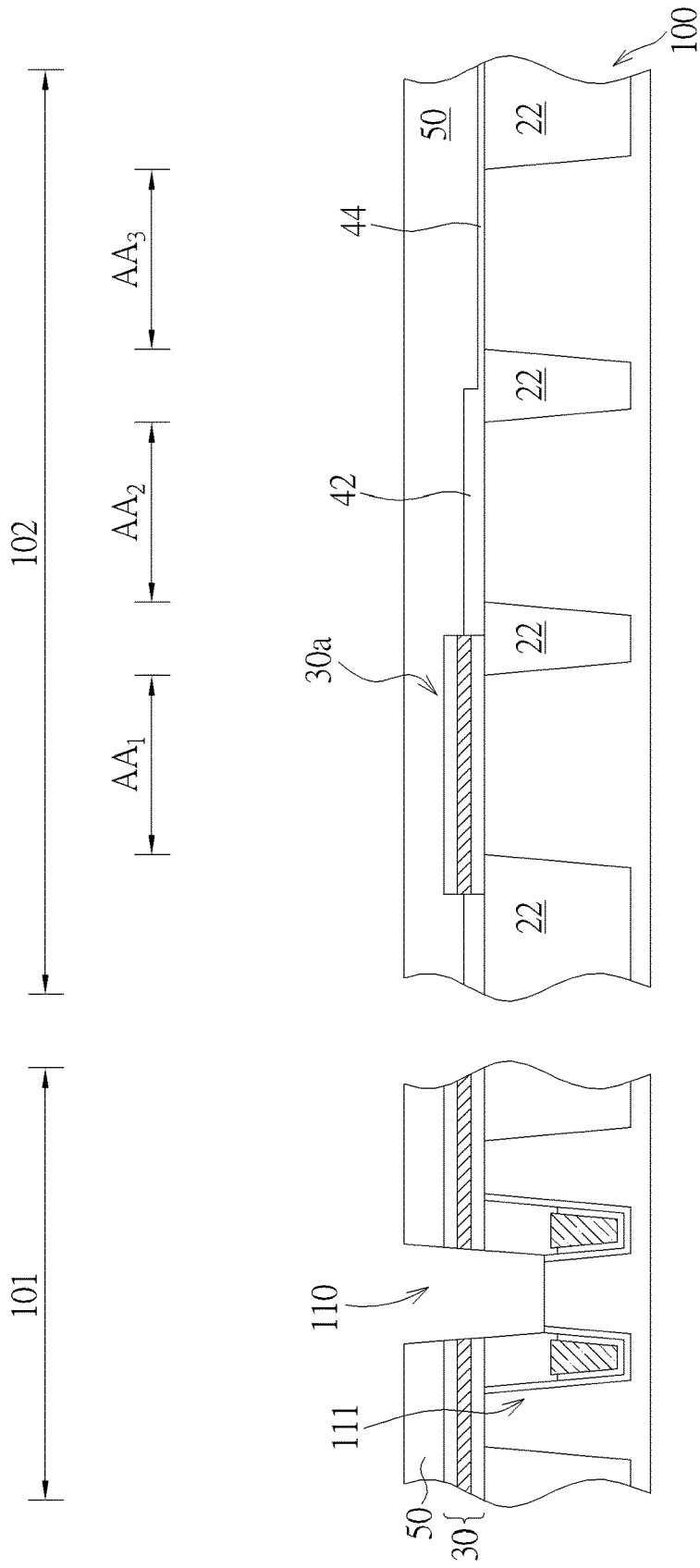

As shown in FIG. 4, a contact hole etching process is performed on the DRAM array region 101, and the first gate conductive layer 50, the ONO layer 30 and a portion of the semiconductor substrate 100 are etched through lithography and etching processes to form a contact hole 110. According to an embodiment of the present invention, the contact hole 110 is located between two adjacent buried word lines 111.

Figure 5:
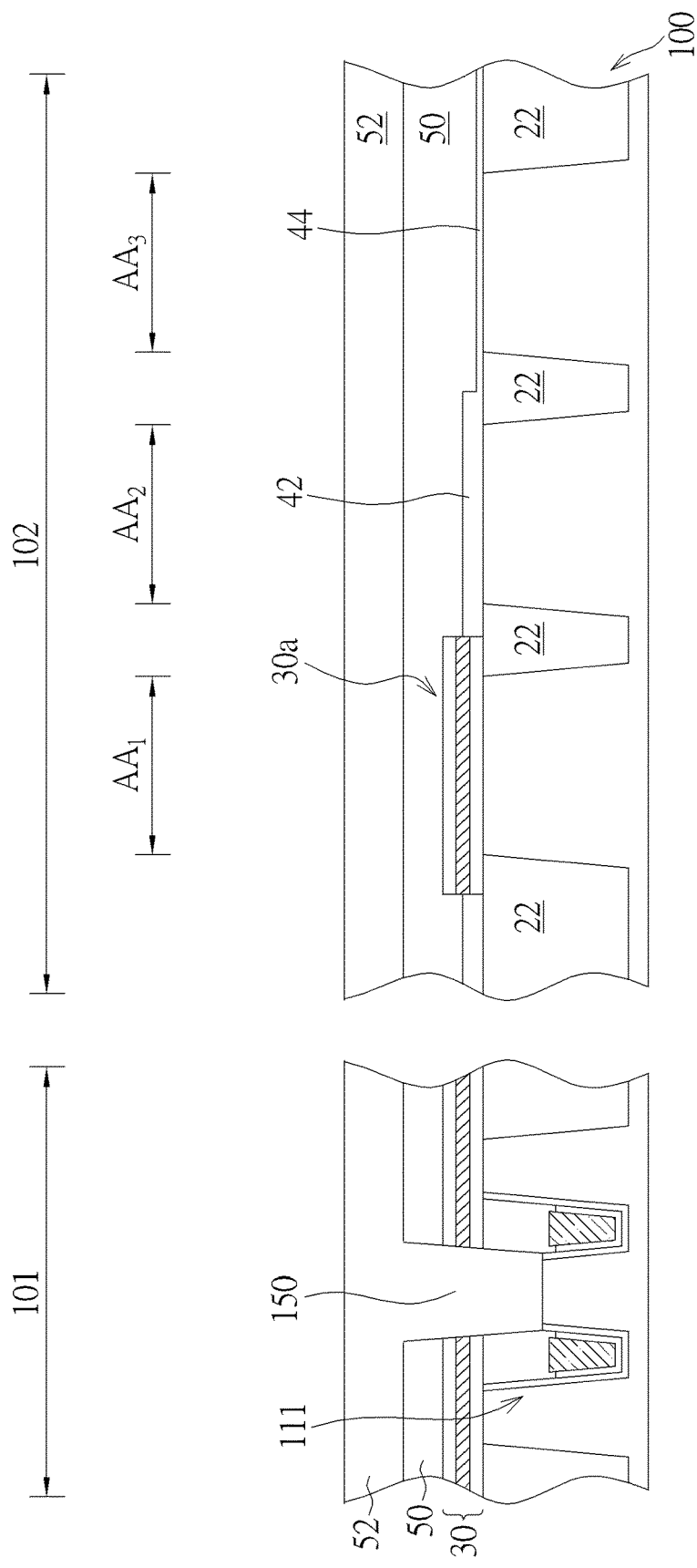

As shown in FIG. 5, after the contact hole etching process in the DRAM array region 101 is completed, a second gate conductive layer 52 is blanket deposited on the DRAM array region 101 and the peripheral region 102. The second gate conductive layer 52 fills the contact hole 110 to form a contact structure 150. According to an embodiment of the present invention, the second gate conductive layer 52 may include polysilicon, but is not limited thereto.

According to an embodiment of the present invention, the second gate conductive layer 52 may then be selectively etched back such that an upper part of the second gate conductive layer 52 is removed.

Figure 6:
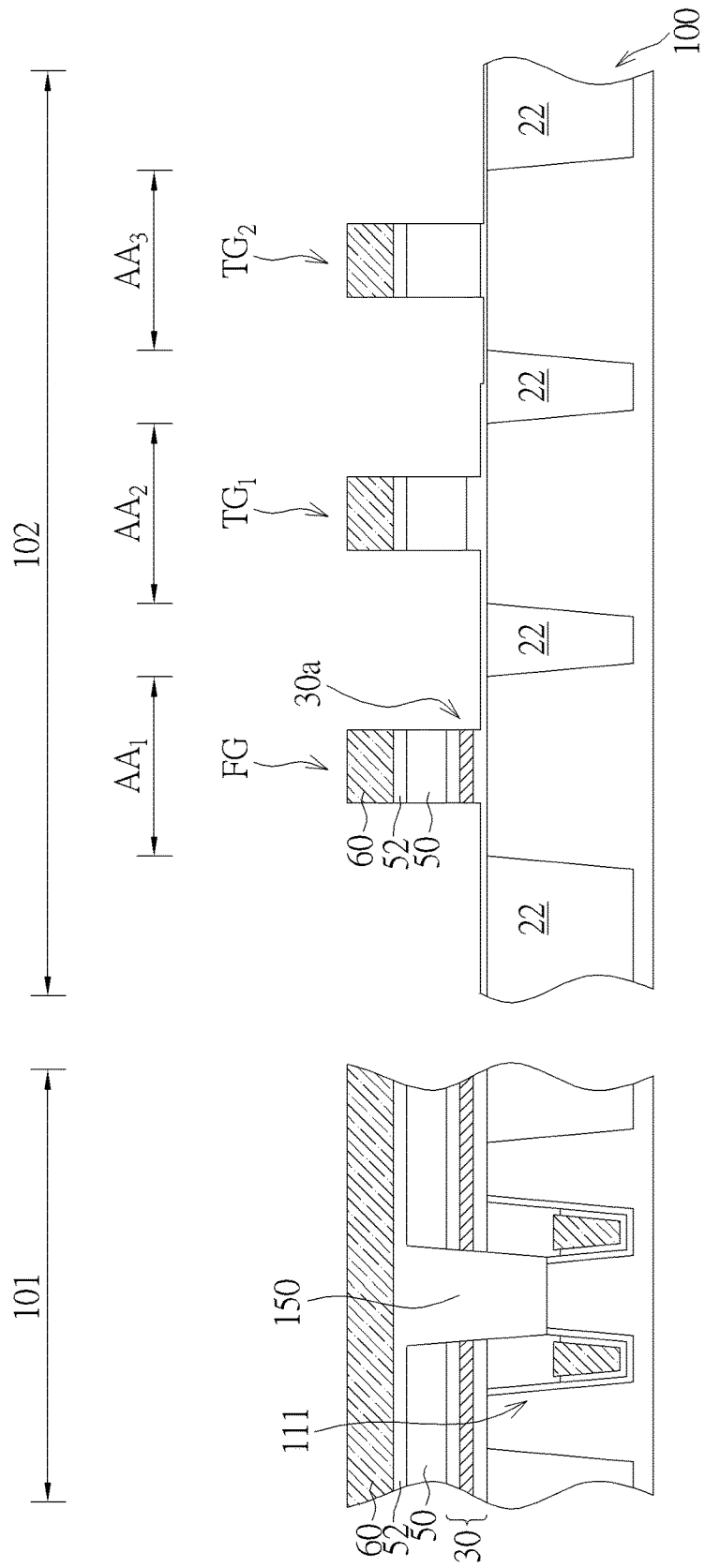

As shown in FIG. 6, a metal layer 60 is formed on the first gate conductive layer 50 and the second gate conductive layer 52. According to an embodiment of the present invention, the metal layer 60 may include tungsten, but is not limited thereto.

Subsequently, the metal layer 60, the first gate conductive layer 50 and the second gate conductive layer 52 are patterned by photolithography and etching to form a flash memory gate FG on the ONO storage structure 30a in the embedded flash memory forming area $AA_1$, a first transistor gate structure $TG_1$ in the first transistor forming region $AA_2$, and a second transistor gate structure $TG_2$ in the second transistor forming region $AA_3$.

Figure 7:
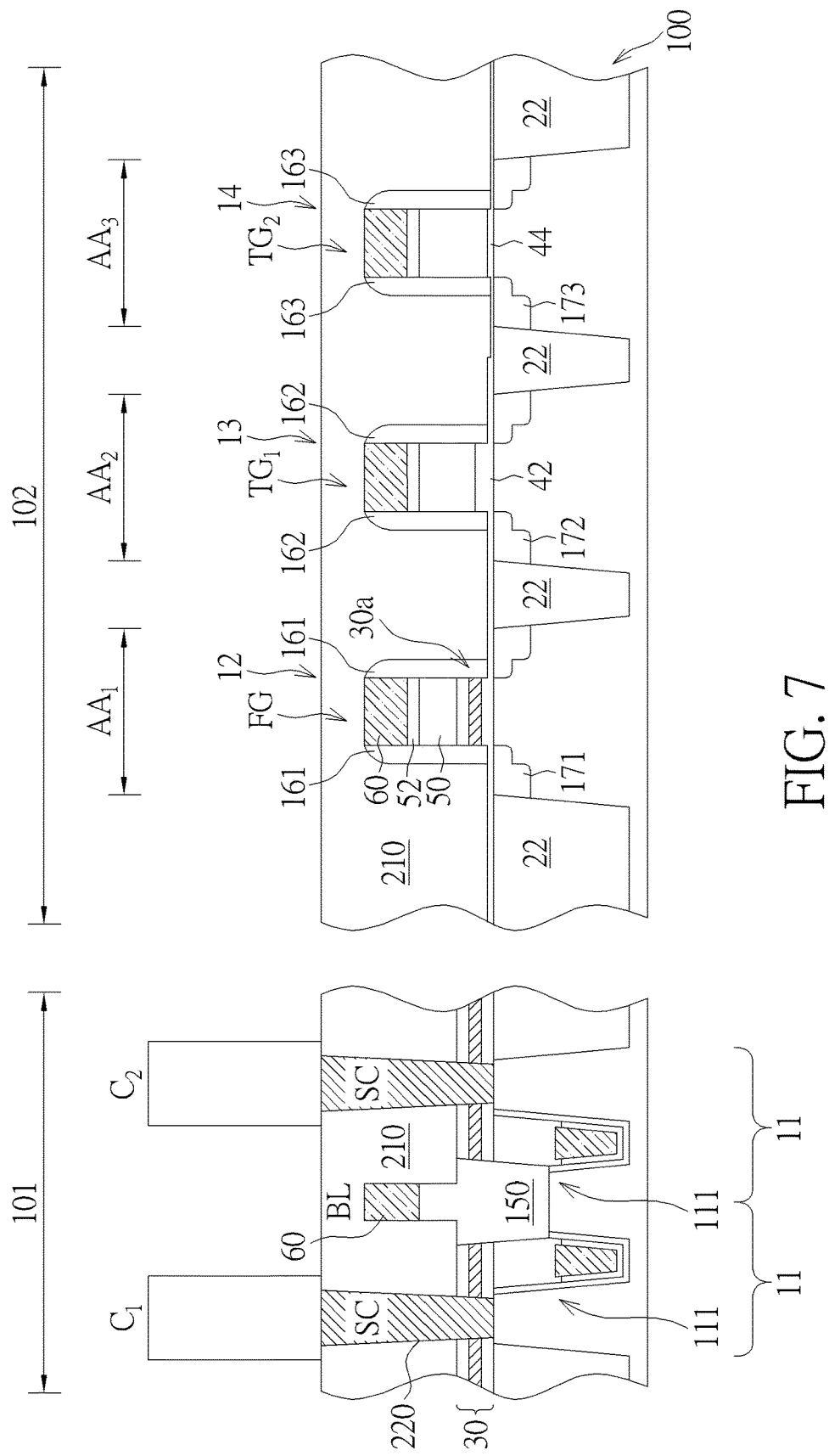

As shown in FIG. 7, sidewall spacers 161, 162, and 163 are formed on the flash memory gate FG, the first transistor gate structure $TG_1$, and the second transistor gate structure $TG_2$, respectively. An ion implanting process is then performed to respectively form doped regions 171, 172 and 173 in the semiconductor substrate 100 on both sides of the flash memory gate FG, the first transistor gate structure $TG_1$, and the second transistor gate structure $TG_2$. The doped regions 171, 172 and 173 may act as drain or source of the transistors. A flash memory 12 is formed in the embedded flash memory forming region $AA_1$, a first transistor 13 is formed in the first transistor forming region $AA_2$, and a second transistor 14 is formed in the second transistor forming region $AA_3$.

Next, the metal layer 60, the first gate conductive layer 50 and the second gate conductive layer 52 are patterned in the DRAM array region 101 by lithography and etching to form a bit line BL. The ONO layer 30 in the DRAM array region 101 serves as an etch stop layer during the formation of the bit line BL.

Next, a dielectric layer 210 is blanket deposited on the semiconductor substrate 100 to cover the DRAM array region 101, the flash memory gate FG, the first transistor gate structure $TG_1$, and the second transistor gate structure $TG_2$.

Next, storage node contact holes 220 are formed in the DRAM array region 101 by photolithography and etching processes. Thereafter, storage node contact (SC) structures are formed in the storage node contact holes 220, respectively.

Finally, capacitor structures $C_1$ and $C_2$ are formed on the storage node contact (SC) structures so that a plurality of DRAM memory cells 11 (only two DRAM memory cells are shown) are formed in the DRAM array area 101.

As shown in FIG. 7, the present invention dynamic random access memory with embedded flash memory is structurally characterized in that the semiconductor substrate 100 has a DRAM array region 101 and a peripheral region 102, wherein the peripheral region 102 includes an embedded flash memory forming area $AA_1$, a first transistor forming area $AA_2$, and a second transistor forming area $AA_3$. A plurality of DRAM memory cells 11 are provided in the DRAM array region 101.

A flash memory 12 is disposed in the embedded flash memory forming area $AA_1$. The flash memory 12 includes an ONO storage structure 30a and a flash memory gate FG. The flash memory gate FG includes a polysilicon layer 50 and a metal layer 60. The metal layer 60 may comprise tungsten.

Within the first transistor forming region $AA_2$, a first transistor 13 is provided. Within the second transistor forming region $AA_3$, a second transistor 14 is provided. The first transistor 13 includes a first gate oxide layer 42 and the second transistor 14 includes a second gate oxide layer 44. The thickness of the first gate oxide layer 42 is greater than the thickness of the second gate oxide layer 44.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM) device with an embedded flash memory, comprising:

a semiconductor substrate having a dynamic random access memory (DRAM) array region and a peripheral region, wherein the peripheral region includes an embedded flash memory forming region and a first transistor forming region;

a plurality of DRAM memory cells in the DRAM array region;

a flash memory in the embedded flash memory forming region, wherein the flash memory comprises an oxide-nitride-oxide (ONO) storage structure and a flash memory gate; and a first transistor in the first transistor forming region, wherein the DRAM memory cells comprise a plurality of buried word lines, a bit line disposed on a contact structure located between the buried word lines, a plurality of storage node contact structures, and a plurality of capacitor structures, wherein the ONO storage structure is made of three stacking layers of silicon oxide, silicon nitride, and silicon oxide.

2. The DRAM device with an embedded flash memory according to claim 1, wherein the peripheral region further comprises a second transistor forming region and a second transistor disposed in the second transistor forming region.

3. The DRAM device with an embedded flash memory according to claim 2, wherein the first transistor comprises a first gate oxide layer, the second transistor comprises a second gate oxide layer, wherein a thickness of the first gate oxide layer is greater than a thickness of the second gate oxide layer.

4. The DRAM device with an embedded flash memory according to claim 1, wherein the flash memory gate comprises a polysilicon layer and a metal layer.

5. The DRAM device with an embedded flash memory according to claim 4, wherein the metal layer comprises tungsten.

6. The DRAM device with an embedded flash memory according to claim 1, wherein the ONO storage structure is disposed directly on the substrate and directly beneath the flash memory gate, without overlapping the trench isolation structure, inside the peripheral region.

* * * * *